United States Patent [19]

Hamada et al.

[11] Patent Number: 5,511,162
[45] Date of Patent: Apr. 23, 1996

[54] AUTOMATIC LSI TESTING APPARATUS USING EXPERT SYSTEM

[75] Inventors: Hiroyuki Hamada; Tohru Tsujide; Masaaki Sugimoto, all of Tokyo, Japan

[73] Assignee: NEC Corporation, Japan

[21] Appl. No.: 82,289

[22] Filed: Jun. 24, 1993

[30] Foreign Application Priority Data

Jun. 26, 1992 [JP] Japan ..................... 4-169054

[51] Int. Cl.$^6$ ............................ G01R 31/28; G06F 11/00
[52] U.S. Cl. ........................................................ 395/183.02
[58] Field of Search ............................. 395/575, 183.02; 371/15.1; 364/274, 274.1, 274.2, 274.3, 274.4, 274.5

[56] References Cited

U.S. PATENT DOCUMENTS

| | | | |
|---|---|---|---|
| 4,817,092 | 3/1989 | Denny | 371/11 |
| 4,881,230 | 11/1989 | Clark | 371/20.1 |
| 5,107,497 | 4/1992 | Lirov | 371/15.1 |
| 5,127,006 | 6/1992 | Subramanian | 371/16.1 |
| 5,157,668 | 10/1992 | Buenzli | 371/15.1 |
| 5,272,704 | 12/1993 | Tong | 371/23 |
| 5,337,320 | 8/1994 | Kung | 371/15.1 |

OTHER PUBLICATIONS

Robach et al., Knowledge-Based Functional Specification of Test and Maintenance Programs. IEEE Transactions on Computer-Aided Design, vol. 8 No. 11 Nov. 1989, pp. 1145–1156.

Arslan et al., An AI Based Approach to Automatic Fault Diagnosis For Mixed Digital/Analogue Circuits, IEE Colloq. No. 154, 1990, pp. 5/1–5/5.

Cosgrove et al., Test Generation Within an Expert System Environment, IEEE Proceedings vol. 138, No. 1, Jan. 1991, pp. 36–40.

"Analysis of Failures on Memories Using Expert System Techniques", T. Viacroze and M. Lequex, 1990 International Test Conference, pp. 823–832.

*Primary Examiner*—Robert W. Beausoliel, Jr.
*Assistant Examiner*—Glenn Snyder
*Attorney, Agent, or Firm*—Laff, Whitesel, Conte & Saret, Ltd.

[57] ABSTRACT

An automatic testing apparatus includes an expert rule which is derived from expert knowledge and defines a tree of successively traceable nodes interconnected by decision branches which lead to a plurality of fault modes. Each of the nodes defines a particular test pattern and a corresponding expected value. One of the nodes is specified and a test pattern defined by the specified node is applied to an LSI chip under test and a result signal is derived therefrom. This result signal is compared with the expected value defined by the specified node to produce a comparison result. The tree of the expert rule is traced from the specified node to a subsequent node according to the comparison result and the subsequent node is specified instead of the previously specified node. The process is repeated as the tree is traced from one node to another until one of the fault modes is reached to identify a chip failure.

4 Claims, 4 Drawing Sheets

FIG. 2
EXPERT KNOWLEDGE DATA (BIT TEST MODE)

| T1 | T2 | T3 | T4 | T5 | T6 | T7 | T8 | T9 | T10 | T11 | T12 | T13 | T14 | T15 | T16 | T17 | T18 | FAULT MODE |
|---|---|---|---|---|---|---|---|---|---|---|---|---|---|---|---|---|---|---|
| P | F | * | * | * | * | F | F | * | * | * | * | * | * | * | * | P | * | A |
| F | P | F | * | * | * | * | * | * | * | * | * | * | * | * | * | * | * | B |
| F | P | P | F | * | * | * | * | * | * | * | * | * | * | * | * | * | * | C |
| P | P | * | * | * | * | * | P | F | * | * | * | F | * | * | * | P | * | D |
| F | F | P | P | F | * | * | * | * | * | * | * | F | * | * | P | * | * | E |
| F | P | P | * | F | * | * | * | * | * | * | * | P | * | * | * | * | F | F |
| F | P | P | * | F | * | * | P | * | * | * | * | P | * | * | * | * | P | G |
| F | P | * | P | * | * | * | * | * | F | * | * | * | * | * | * | * | * | H |
| P | F | P | * | * | P | * | * | P | * | F | * | F | * | * | F | * | * | I |
| F | P | * | * | * | * | * | P | P | P | F | * | * | * | * | * | * | * | J |
| F | F | * | * | * | * | * | P | P | P | F | * | * | F | * | * | * | * | K |
| P | F | * | * | * | * | * | P | P | P | F | * | * | P | * | * | * | * | L |

LEGEND: T = TEST PATTERN
P = PASS
F = FAIL-TO-PASS
* = TEST NOT REQUIRED

BIT TEST MODE

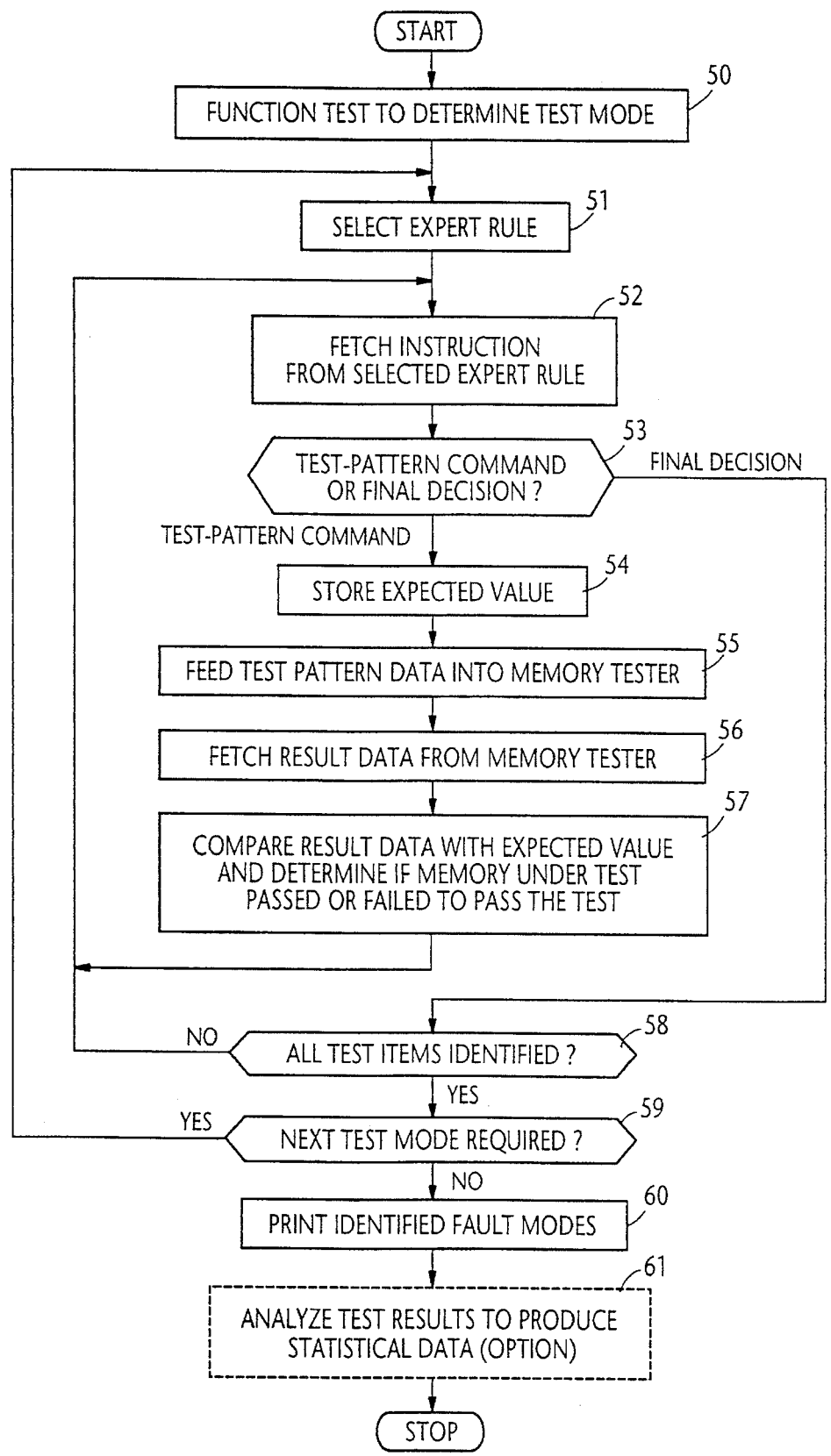

AUTOMATIC LSI TESTING APPARATUS USING EXPERT SYSTEM

BACKGROUND OF THE INVENTION

1. Field of the Invention

The present invention relates generally to LSI (large scale integration) chip testing, and more specifically to testing of LSI chips using expert systems.

2. Description of the Related Art

Conventional LSI memory testing involves the use of a memory tester with which a test engineer is engaged in a dialog mode to apply a test pattern to an LSI memory under test. The result of the test is obtained in a bitmap format, which is checked by the engineer to determine the next test pattern or determine the possible location of a fault. However, with the ever increasing memory capacity the amount of data to be manually analyzed is becoming difficult. To overcome this difficulty, T. Viacroze et al describe a memory testing system in a paper "Analysis of Failures on Memories Using Expert System Techniques", 1990 International Test Conference, in which an expert system is run on an IBM computer PS/2 connected to a memory tester. The system engages an operator in a dialog mode and provides expert advices for creating and executing additional tests until a solution is reached.

There is still a need to implement testing of LSI chips using expert systems without human intervention in order to minimize the amount of time involved with each LSI chip.

SUMMARY OF THE INVENTION

It is therefore an object of the present invention to provide an automatic LSI chip testing apparatus using expert systems.

According to a broader aspect of the present invention, there is provided an expert rule which is derived from expert knowledge. The expert rule defines a tree of successively traceable nodes interconnected by decision branches which lead to a plurality of fault modes, wherein each of the nodes defines a particular test pattern and a corresponding expected value. One of the nodes is specified and a test pattern defined by the specified node is applied to an LSI chip under test and a result signal is derived therefrom. This result signal is compared with the expected value defined by the specified node to produce a comparison result. The tree of the expert rule is traced from the specified node to a subsequent node according to the comparison result and the subsequent node is specified instead of the previously specified node. The process is repeated as the tree is traced from one node to another until one of the fault modes is reached, and a chip failure is identified as the fault mode that is reached.

Preferably, an expert knowledge table is provided which maps relationships between a plurality of the test patterns and the fault modes, and the expert rule is derived from the expert knowledge table. Furthermore, the expert rule is derived from all possible combinations of "opens" and "shorts" between successive layers of a three-dimensional wiring structure of the LSI chip.

According to a specific aspect of the present invention, there are provided a plurality of expert rules derived from expert knowledge, each of the expert rules defining a tree of successively traceable nodes interconnected by decision branches leading to a plurality of fault modes. Each of the nodes defines a particular test pattern and a corresponding expected value. Test results from an LSI chip are derived and analyzed into different failure categories. One of the failure categories is selected and one of the expert rules corresponding to the selected category is selected. One of the nodes of the selected expert rule is selected corresponding to a chip failure belonging to the selected category. A test pattern defined by the specified node is applied to the LSI chip, and a result signal derived therefrom is compared with the expected value defined by the specified node to produce a comparison result. The tree of the selected expert rule is traced from the specified node to a subsequent node according to the comparison result and the subsequent node is specified instead of the node previously specified. The process is repeated as the tree of the selected expert rule is traced until one of the fault modes is reached, and the chip failure is identified as the fault mode reached.

BRIEF DESCRIPTION OF THE DRAWINGS

The present invention will be described in further detail with reference to the accompanying drawings, in which:

FIG. 2 is a representation of a table mapping relationships between test patterns and fault modes for a bit test mode;

FIG. 4 is a flowchart describing a sequence of instructions performed by the controller of a personal computer.

DETAILED DESCRIPTION

Figure 1:
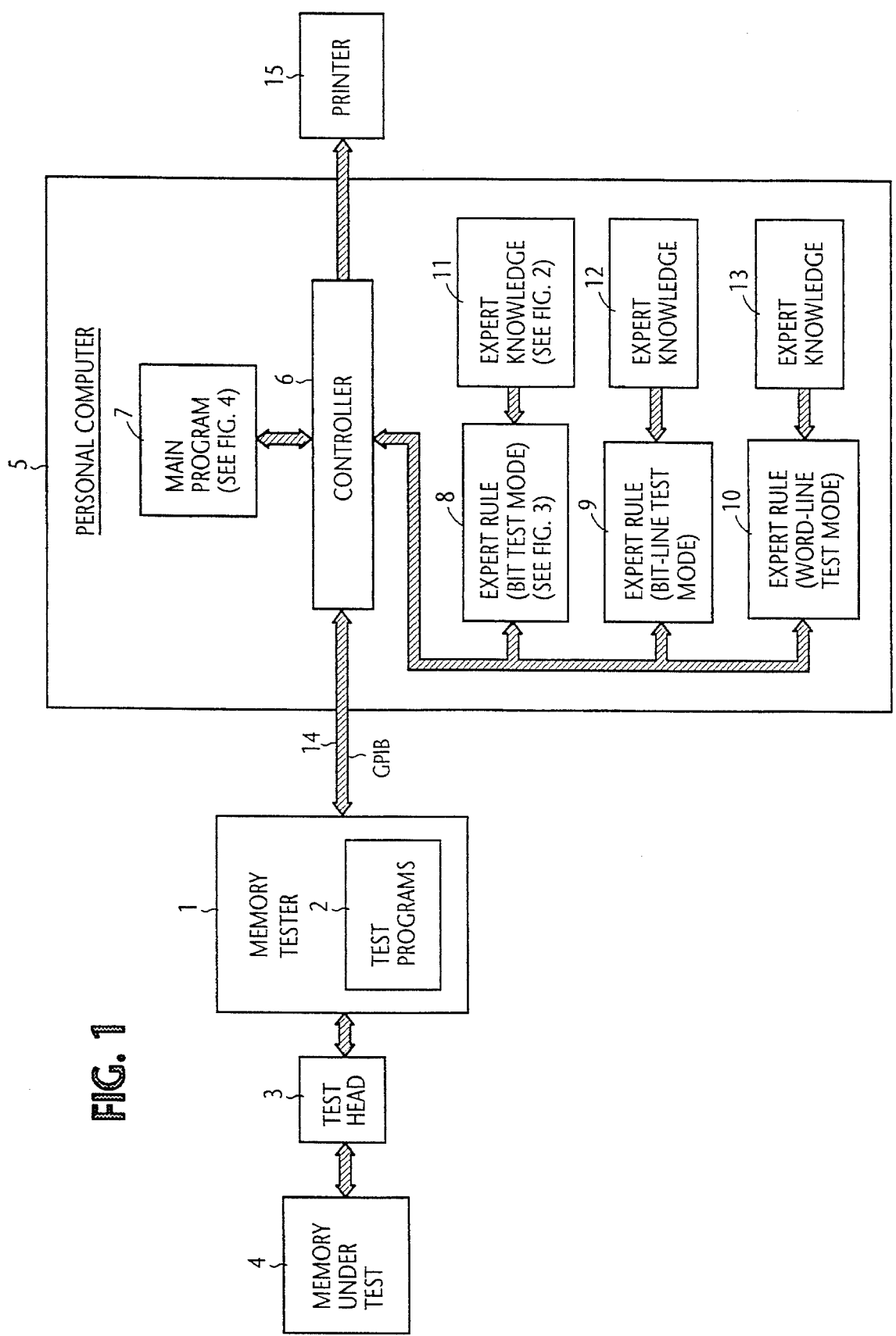
FIG. 1 is a schematic block diagram of a memory testing apparatus according to the present invention.

Referring now to FIG. 1, there is shown a memory testing apparatus according to the present invention. The apparatus is generally comprised of a memory tester 1 of known design and a personal computer 5. Memory tester 1 is connected to a test head 2 which is in turn connected to an LSI memory 4 under test. The personal computer 5 comprises a controller 6 for controlling a memory system in which the main program 7, expert rules 8, 9 and 10, and expert knowledge ("know-how") data 11, 12 and 13 are installed. In the memory tester 1 test programs 2, such as MARCH CELL-H, MARCH CELL-L, PAGE and V.BUMP, are installed. Controller 6 is connected to memory tester 1 through a bus system 14 (which is known as General-Purpose Interface Bus defined by ANSI/IEEE 488-1978) so that the main program 7 can be shared by the memory tester 1 as it runs the test programs 2. A printer 15 is connected to the controller 6 to produce a printout of test results.

Expert rules 8, 9 and 10 are expert system programs which define expert rules for bit test mode, bit-line test mode and word-line test mode, respectively. Expert knowledge data 11 is in the form of a table that defines a map between test patterns and fault modes. The table shown in FIG. 2 is prepared for deriving the expert rule 8 on the basis of the expert knowledge of device engineers concerning bit failures and defines a map between all possible fault locations and all possible fault modes. Preferably, such a map may define all possible combinations of "opens" and "shorts" between successive layers of a three-dimensional wiring structure of an LSI memory. The map is then analyzed according to the expert knowledge of circuit (layout) engineers so that the expert knowledge of both device engineers and circuit engineers are combined and built into the form shown in FIG. 2. Expert knowledge data 12 and 13 are in the form of tables similar to that shown in FIG. 2.

In FIG. 2, fault modes A through L are defined for test patterns T1 to T18. Each test pattern has an expected value which is used to evaluate the result of a test using the test pattern. Symbol "P" represents a "pass" decision when the result of a given test pattern is equal to the expected value, and symbol "F" represents a "fail-to-pass" decision when that result fails to attain the expected value. The asterisk indicates an item where testing is not required. Fault mode B, for example, is one that occurs if test pattern T2 results in a "pass" decision and test patterns T1 and T3 result in a "fail-to-pass" decision.

Figure 3:
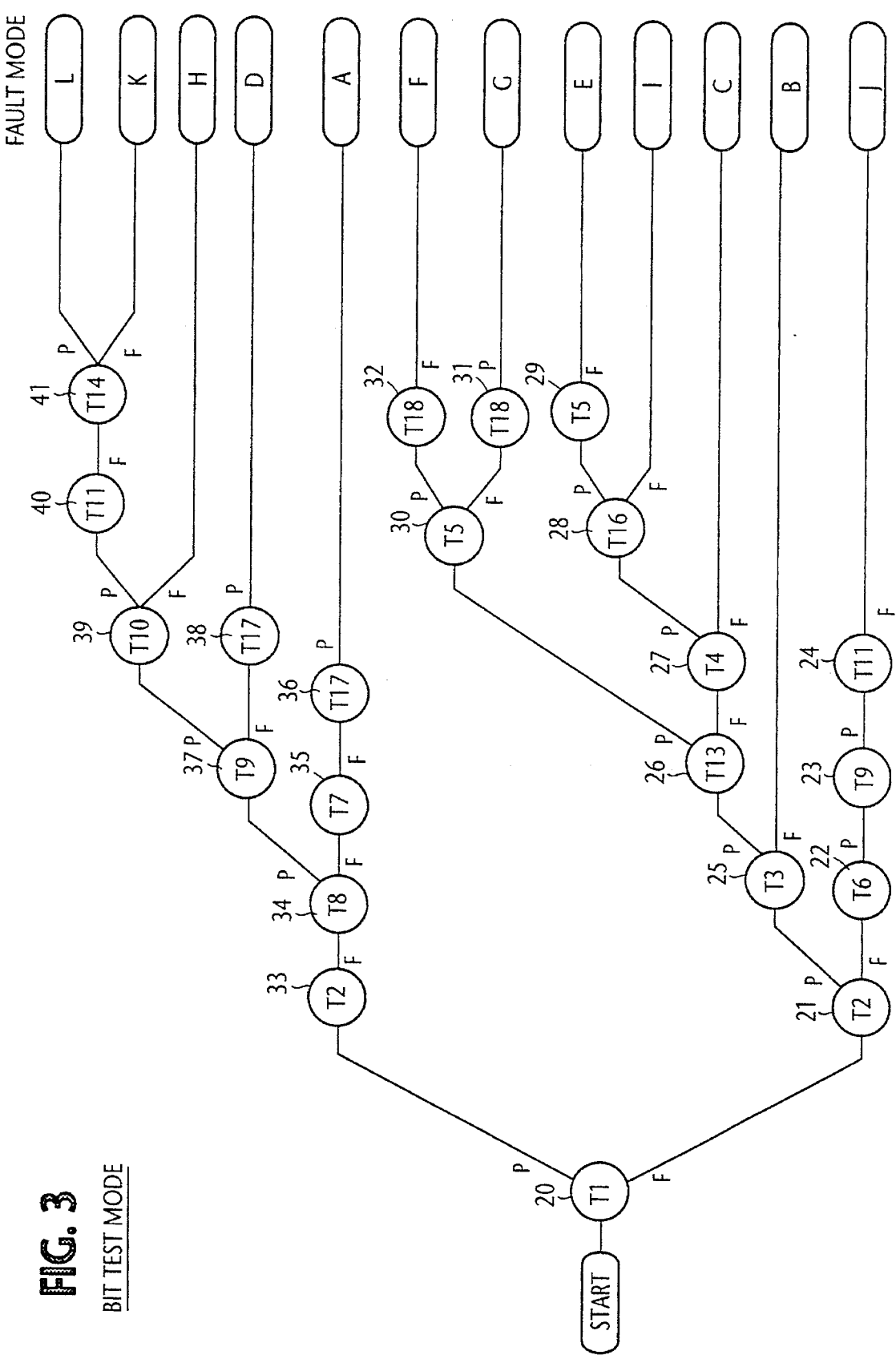
FIG. 3 is a tree diagram representing the logic sequences of an expert rule.

Expert rule 8 is derived from the matrix of FIG. 2, preferably, using an automatic flowchart generation program. A suitable program for the present invention is one that is commercially available under the tradename "XpertRule ProtoTyper". It can be depicted as a tree of successively traceable test pattern commands, or nodes interconnected by decision ("pass" and "fail-to-pass") branches which lead to the fault modes A to L as shown in FIG. 3. Each node of the tree defines a particular test pattern and a corresponding expected value. When a node is specified a test-pattern command signal is generated containing the defined test pattern Ti (where i=1 through 18) and expected value with which the result of the test is compared to determine whether the memory has passed or failed to pass the test. A known expert input tool can be used to install expert knowledge tables 11, 12 and 13. On the basis of expert knowledge data 12 and 13, expert rules 9 and 10 are also derived in a manner similar to the manner by which expert rule 8 is derived from expert knowledge table 11.

As will be described, if expert rule 8 is selected, a node 20 is initially specified and a test-pattern T1 command and a corresponding expected value are generated, and the memory 4 is tested by the memory tester 1 with a test pattern T1. The result of the test is detected by memory tester 1 and applied to controller 6 where it is compared with the expected value of node 20. If the comparison indicates that the result meets the expected value, the memory under test is said to have passed the test and a "pass" decision is issued, otherwise, the memory is said to have failed to pass the test and a "fail-to-pass" decision is issued. The result of the comparison is supplied from controller 6 to expert rule 8 to trace the tree and specify a subsequent node. If the result of comparison at node 20 is a "fail-to-pass" decision, a node 21 is specified to generate a test-pattern T2 command and a corresponding expected value. If the T2-command at node 21 results in a "fail-to-pass" decision, a node 22 is specified and a test-pattern T6 command is generated. If the result of test pattern-T6 command at node 22 is a "pass" decision, a node 23 is specified and a test-pattern T9 command is generated, which is then followed by a node 24 for generating a T11-command if T9-command at node 23 results in a "pass" decision. If T11-command 24 results in a "fail-to-pass" decision, the expert rule 8 generates an instruction indicating that the memory bit failure is identified as fault mode J.

Likewise, if the T1-command at node 21 results in a "pass" decision, a test pattern T3-command at node 25 is generated, and if it results in a "fail-to-pass" decision (i.e., T3=F), the memory bit failure is identified as fault mode B. If the result of the T3-command at node 25 is a "pass" decision, a T13-command at node 26 is generated. If T13=F, a T4-command is generated at node 27. If T4=F, the memory bit failure is identified as fault mode C. If the test pattern T4-command at node 27 is a "pass" decision (i.e., T4×P), a T-16 command is generated at node 28. If T16=F at node 28, the bit failure is identified as fault mode I. If T16=P at node 28, a T5-command is generated at node 29 and if T5=F, the bit failure is identified as fault mode E.

If T13=P at node 26, the bit failure is identified as fault mode G if T5=F and T28=P at nodes 30 and 31, respectively, or identified as fault mode F if T5=P and T28=F at nodes 30 and 31, respectively.

If the test pattern T1 command at node 20 results in a "pass" decision, T2=F or P, T8=F or P are tested respectively at nodes 33 and 34. If T2=F and T8=F, T7=f and T17=P are tested respectively at nodes 35 and 36 to identify the bit failure as fault mode A.

If T8=P at node 34, a decision is reached that the bit failure is the fault mode D if T9=F and T17=P at nodes 37 and 38 respectively. Likewise, a decision that the bit failure is the fault mode H will be reached if T9=P at node 37 and T10=F at node 39. If T10=P at node 39, T11=F and T14=P or F are tested respectively at nodes 40 and 41 to identify the failure as fault mode K if T14=F, or fault mode L if T14=P.

FIG. 4 shows a sequence of instructions described by the main program 7 to be performed by the controller 6. Program execution starts with step (node) 50 to instruct the memory tester 1 to perform a function test on the memory 4 using one of the test programs 2 and analyze the test results into different categories of test including bit failure mode, bit-line test mode and word-line test mode. If a MARCH test procedure is used, a "marching one" pattern test is performed on the memory under test by first filling it with 0s and reading it out. A single 1 is then written into the first address and this location is checked. The first and second addresses of the memory are then set to 1 and checked. This procedure of progressively filling up the memory array with 1s continues until all addresses are full. A "marching-zero" pattern test is then performed, progressively setting the memory back to all 0s and checking the 0-valued cells at each step.

Exit then is to step 51 to select one of the expert rules 8, 9 and 10. Control proceeds to step 52 to generate a request signal to fetch an instruction from the selected expert rule. The instruction is either a test-pattern command or a final decision. The test-pattern command is a signal containing a particular test pattern and a corresponding expected value against which the result of the particular test pattern is compared. The final decision is a signal identifying one of fault modes A through L. In step 53, the instruction fetched from the selected expert rule is checked to see if that instruction is a test-pattern command or a final decision. If the instruction is a test-pattern command, control stores the expected value contained in the fetched instruction (step 54) and feeds the test pattern data into memory tester 1 (step 55). In response, memory tester 1 generates and supplies a corresponding test pattern to the memory under test through the test head 3. A result of the test is then obtained and supplied from test head 3 to memory tester 1 where it is converted to a numerical value. Controller 6 fetches the test result from the memory tester 1 (step 56) and compares it with the stored expected value and determines that the memory passed the test if the result data is equal to the expected value or determines that the memory failed to pass the test if the result data is not equal to the expected value (step 57). Control then returns to step 52 to repeat the above process to fetch the next instruction from the selected expert rule. If the decision at step 53 indicates that the instruction is a final decision, control exits to step 58 to check to see if the fault modes of all test items have been identified. If not, control returns to step 52, and if the answer is affirmative control branches at step 58 to step 59. In step 59, control determines whether there is a test mode yet to be performed. If there is one, control branches at step 59 to step 51 to select the next expert rule and repeats the above process. If all the necessary test modes have been executed, control branches at step 59 to step 60 to operate a printer 15 to produce a printout of the fault modes of all items of failure. As an option, the test results are statistically analyzed (step 61) to produce a list of fault data sorted according to different categories of memory failures.

Assume that if a bit failure is detected (step 50), the expert rule 8 is selected at step 51 and controller 6 receives a test-pattern T1 command at node 20 from expert rule 8 as it executes step 52. If this bit failure is a fault mode B, for example, the expected value contained in that command is stored (step 54). A test is conducted on the memory 4 using test pattern T1 (step 55). The result of this test is checked against the expected value contained in the T1-command at node 20 (step 56) and the decision at step 57 yields a negative answer (or "fail-to-pass" decision). Controller 6 addresses the expert rule 8 with the "fail-to-pass" result and fetches test-pattern T2 command from node 21 (step 52). A "pass" result is taken (step 57) and a test-pattern T3 command is fetched fromat node 25 (step 52). Step 57 then issues a "fail-to-pass" decision. This decision causes the controller 6 to read a fault-mode decision from expert rule 8 indicating that the bit failure is identified as fault mode B.

The foregoing description shows only one preferred embodiment of the present invention. Various modifications are apparent to those skilled in the art without departing from the scope of the present invention which is only limited by the appended claims. Therefore, the embodiment shown and described is only illustrative, not restrictive.

What is claimed is:

1. In an apparatus comprising a plurality of expert knowledge tables associated respectively with a plurality of failure categories, each of the expert knowledge tables mapping relationships between a plurality of test patterns and a plurality of fault modes, means for storing memories with a plurality of expert rules respectively associated with said expert knowledge tables, each of the stored expert rule memories defining a tree of successively traceable nodes interconnected by decision branches leading to a plurality of fault modes, each of the nodes defining one of said test patterns of the associated expert knowledge table and a corresponding expected value, a method of using said apparatus comprising the steps of:

a) deriving a test result from an LSI (large scale integration) chip under test and analyzing the test result and identifying the test result as one of said failure categories;

b) selecting one of said stored expert rule memories corresponding to the identified category;

c) specifying one of the nodes of the selected stored expert rule memory corresponding to a chip failure;

d) applying a test pattern defined by the specified node to said chip and deriving a result signal therefrom;

e) comparing the result signal with the expected value defined by the specified node to produce a comparison result;

f) tracing the tree of the selected stored expert rule memory according to the comparison result of step e) from the specified node to a subsequent node and specifying the subsequent node instead of the node previously specified;

g) repeating the steps (d) to (f) until one of said fault modes is reached; and h) identifying said chip failure as the fault mode reached by the step (g).

2. A method as claimed in claim 1, further comprising the steps of repeating the steps (a) to (h) for each of a plurality of chip failures so that each of the chip failures is identified as one of the fault modes, and making a statistical record of the identified fault modes.

3. An apparatus for testing an LSI (large scale integration) chip, comprising:

testing means for applying a test signal to an LSI chip and deriving therefrom an output signal;

a plurality of expert knowledge tables associated respectively with a plurality of failure categories, each of the expert knowledge tables mapping relationships between a plurality of test patterns and a plurality of fault modes;

a plurality of expert rule memories associated respectively with said expert knowledge tables, each of the expert rule memories defining a tree of successively traceable nodes interconnected by decision branches leading to the fault modes of the associated expert knowledge table, each of said nodes defining one of said test patterns of the associated expert knowledge table and an expected value; and control means for analyzing the output signal of said testing means and identifying the output signal as one of said failure categories, selecting one of said expert rule memories according to the identified failure category, specifying one of the nodes of the selected expert rule memory corresponding to a chip failure, causing said testing means to apply said test signal according to the test pattern defined by the specified node, comparing the output signal of said testing means with the expected value defined by the specified node in order to produce a first comparison result, tracing the tree of the selected expert rule memory according to the first comparison result to a subsequent node, causing said testing means to apply said test signal according to the test pattern defined by the subsequent node, comparing the output signal of said testing means with the expected value defined by said subsequent node to produce a second comparison result, and tracing said tree toward one of said fault modes according to the second comparison result.

4. An apparatus as claimed in claim 3, wherein the expert rules are derived from all possible combinations of "opens" and "shorts" between successive layers of a three-dimensional wiring structure of said LSI chip.

* * * * *